United States Patent [19]

Kosugi et al.

[11] Patent Number: 4,530,587
[45] Date of Patent: Jul. 23, 1985

[54] STEP TYPE MASK ALIGNER

[75] Inventors: Masao Kosugi, Yokohama; Tadashi Konuki, Tokyo; Kazuo Iizuka, Kawasaki, all of Japan

[73] Assignee: Canon Kabushiki Kaisha, Tokyo, Japan

[21] Appl. No.: 555,525

[22] Filed: Nov. 28, 1983

[30] Foreign Application Priority Data

Dec. 1, 1982 [JP] Japan ................................ 57-210988

[51] Int. Cl.³ .............................................. G03B 27/42
[52] U.S. Cl. ........................................ 355/53; 355/77
[58] Field of Search ....................... 355/40, 43, 45, 53, 355/54, 77

[56] References Cited

U.S. PATENT DOCUMENTS

| | | | |
|---|---|---|---|
| 3,716,296 | 2/1973 | Springer et al. | 355/53 |
| 3,722,996 | 3/1973 | Fox | 355/53 |
| 4,155,642 | 5/1979 | Lacombat | 355/544 |
| 4,427,292 | 1/1984 | Buchanan | 355/54 |

Primary Examiner—Richard A. Wintercorn
Attorney, Agent, or Firm—Fitzpatrick, Cella, Harper & Scinto

[57] ABSTRACT

A mask aligner for stepping and exposing a wafer in accordance with a shot arrangement, including an input device to which wafer dimension, chip dimension and a chip pattern for one shot are inputted, a selector for selecting a shot arrangement mode from plural shot arrangement modes based on the above input signals, a controller for effecting the shots in accordance with the selected modes to minimize the time required for exposing the one entire wafer or to maximize the number of chips exposed per unit.

11 Claims, 9 Drawing Figures

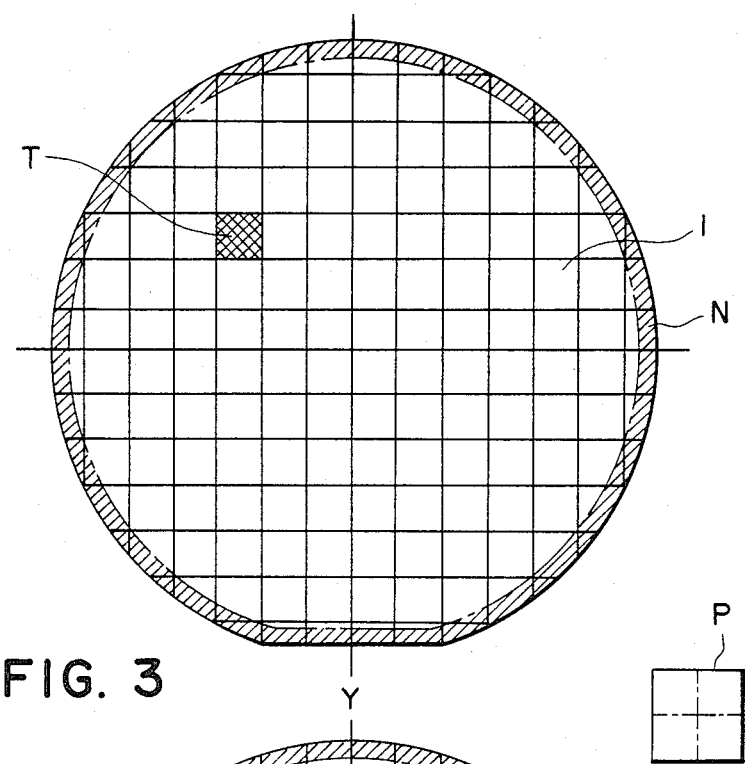
FIG. 3
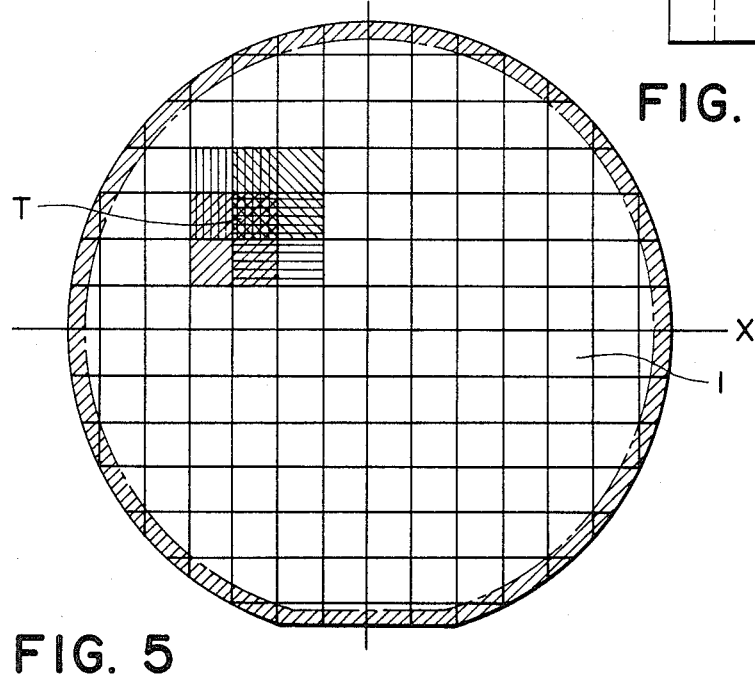
FIG. 4
FIG. 5

STEP TYPE MASK ALIGNER

BACKGROUND OF THE INVENTION

1. Field of the Invention

The present invention relates to a step type mask aligner, usable for manufacturing semiconductor devices, of a step-and-repeat alignment and exposure type. According to the present invention, the most desirable mode of the shot arrangements is selected with the use of a microprocessor.

2. Description of the Prior Art

A so-called stepper type alignment and exposure apparatus is known, wherein a circuit pattern on a reticle or mask is projected onto a small area of silicon wafer having a photoresist surface through a reduction projection optical system, and then the wafer is stepped to be exposed to the same pattern at the next area; this cycle is repeated. Where the projection optical system has such a small exposable area that a pattern for only one chip can be projected in one shot to the wafer, as in some of conventional steppers, the arrangement, that is, the places and order of the shots for the wafer, is determined indiscriminately for all wafers with no problem. However, the recent stepper which has a larger exposable area, i.e., the larger field of image makes it possible that one shot exposes plural chip patterns. In such a case, there is a problem that trial and error must be repeated to obtain the proper arrangement of shots from the standpoint of productivity.

SUMMARY OF THE INVENTION

Accordingly, it is a principal object of the present invention to provide a step type aligner of full automatic operation, wherein the time required for processing one wafer, the maximum number of processed wafers and best throughput can be provided on the basis of the simulation of various modes or arrangements of shots.

This and other objects, features and advantages of the present invention will become more apparent upon a consideration of the following description of the preferred embodiment of the present invention taken in conjunction with the accompanying drawings.

According to the preferred embodiment of the present invention, the exposure apparatus comprises means for producing a step relative movement between a mask and a radiation sensitive member, means for providing a first signal relating to an arrangement of plural chip patterns of the mask for one shot for exposing the radiation sensitive member to the chip patterns, means for providing a second signal relating to a dimension of one chip pattern, means for providing a third signal relating to a dimension of the radiation sensitive member, means for selecting a shot arrangement from plural possible shot arrangements on the basis of the first, second and third signals, and means for controlling said step movement means in accordance with the selected shot arrangement.

BRIEF DESCRIPTION OF THE DRAWINGS

FIG. 3 is a plan view of an example of a patterned wafer;

FIG. 4 shows an example of exposure pattern layout;

FIG. 5 illustrates relationships between the patterned wafer and a given chip area of a wafer;

DESCRIPTION OF THE PREFERRED EMBODIMENTS

A preferred embodiment of the present invention will now be described in detail in conjunction with the accompanying drawings.

Figure 1:
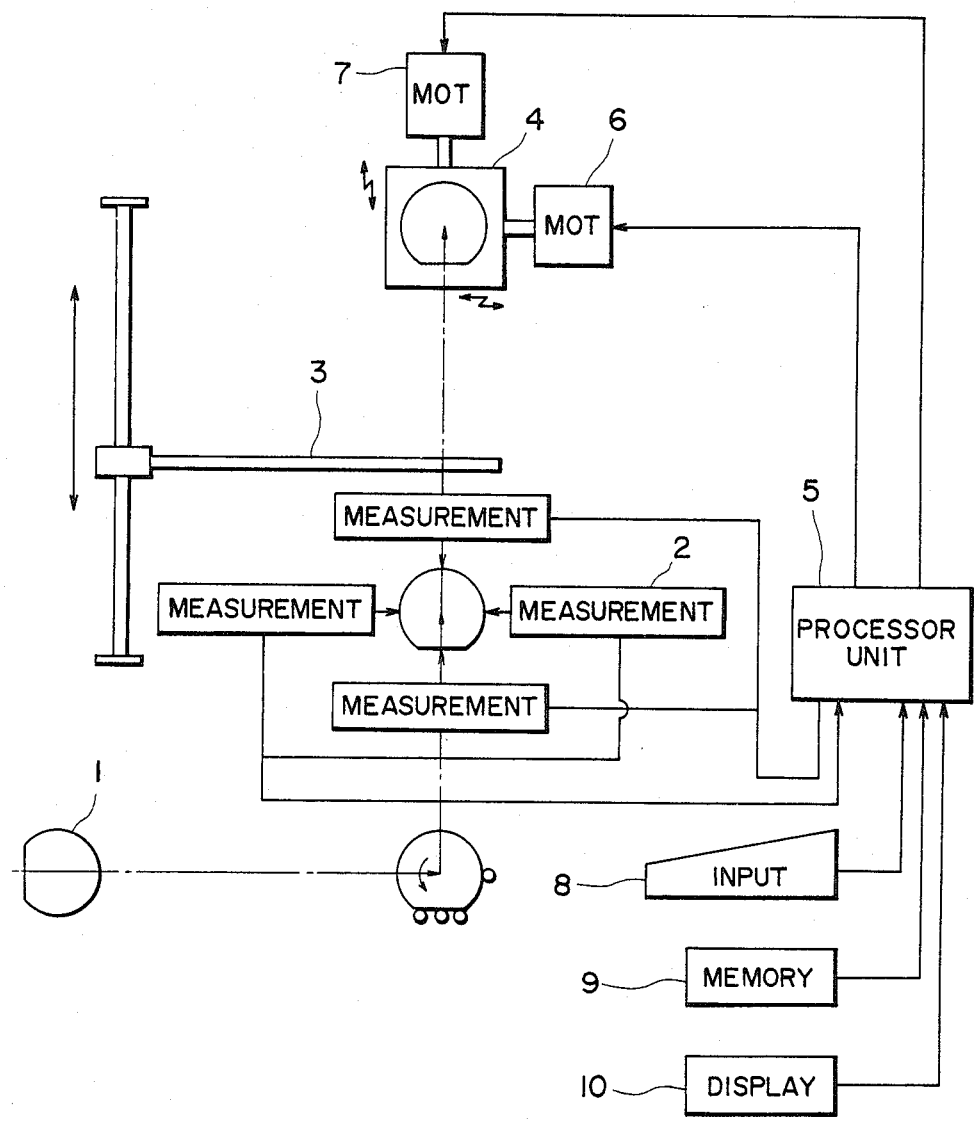
FIG. 1 shows an arrangement of a wafer carrying system of an apparatus according to the present invention.

FIG. 1 shows a diagram of an apparatus according to an embodiment of the present invention. A wafer 1 has been patterned by the prior processing. Along the passage for bringing the wafer 1 in, there are provided a dimension measuring device 2, a supplying device 3 and an X-Y stage 4 for carrying the wafer 1 and stepping the same. The X-Y stage is moved in the X direction by an X servomotor 6 and in the Y direction by a Y servomotor 7. The servomotors 6 and 7 are controlled by a processor control unit 5 including a microprocessor. The processor control unit 5 contains a program for operating selector means and driver means which will be described hereinafter. Also, it is connected to key-in type data input and setting device 8, a memory device 9 such as a magnetic disk, and a display device 10 such as a monitoring TV.

Figure 2:
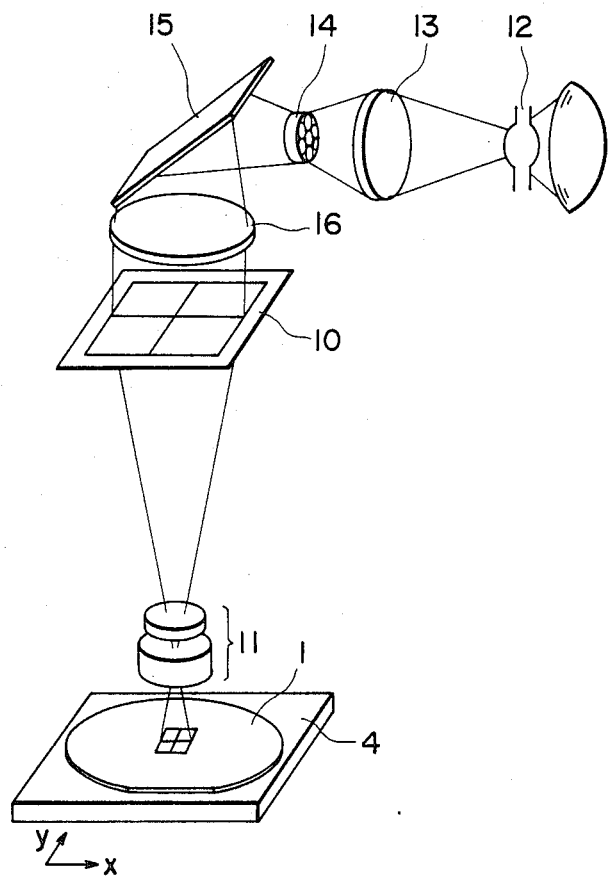
FIG. 2 shows a projection optical system and an illumination system of the apparatus according to the present invention.

FIG. 2 shows an illumination optical system and a projection optical system, wherein a reticle 10 has four actual chip patterns. An image of the reticle is projected onto the wafer 1 through the projection optical lens system 11. The illumination optical system includes a light source 12 including an Hg lamp, a condenser lens 13, an optical integrator for increasing the uniformity of the illumination light, a reflecting mirror 15, and a collimator lens 16. The beam emitted from the light source 12 is condensed on the optical integrator 14 by a condenser lens 13. The beam from the optical integrator is collimated by the collimator lens 16 and then uniformly illuminates the reticle 10.

The wafer 1 (FIG. 1) is subjected to the dimension determining operation by two sets of the measurement device 2 located along a passage of the wafer so that the outer diameter of the wafer 1 is measured in the two directions. The measurements are inputted to the processor control unit 5. To the data input device 8, various information for the next step is inputted, such as the information relating to the number of patterns per shot, the information relating to the ineffective areas of the wafer 1 and the dimensions of a chip or shot. On the basis of those pieces of information, the processor control unit 5 executes simulations for various shot arrangements in accordance with the predetermined process which has been programmed therein. Thereafter, the processor control unit 5 then determines or selects the exposure shot arrangement from the first priority standpoint of the effective number of chips from one wafer, and from the standpoint of the shortest time required for processing one entire wafer, and also from the standpoint the effective chips per unit time, and additionally in terms of the productivity. Based on the determination, the processor control unit 5 controls the servomotor 6 and 7 for stepping the X-Y stage 4 in the order determined thereby.

The determination will be described more in detail.

FIG. 3 shows a wafer 1 which has been patterned in the previous processing. Designated by reference character T is a given chip within the effective area, and N is an ineffective area set by the data input and setting device 8. It is assumed that the wafer 1 is exposed stepwise to the exposure pattern P consisting of 4 chip multi-patterns at one shot as shown in FIG. 4.

FIG. 5 shows possible ways of exposing the chip T area to the exposure pattern P. It will be understood from this Figure that there are four possible ways of combining the chip T and the exposure pattern P.

Four typical examples of shot arrangements determined from the high priority standpoint of the largest number of effective chips are shown in Figures 6, 7, 8 and 9, for the first, second, third and fourth Examples. For those examples, the number of effective chips, the number of shots and the time required for one wafer are as follows:

TABLE

Figure 6:
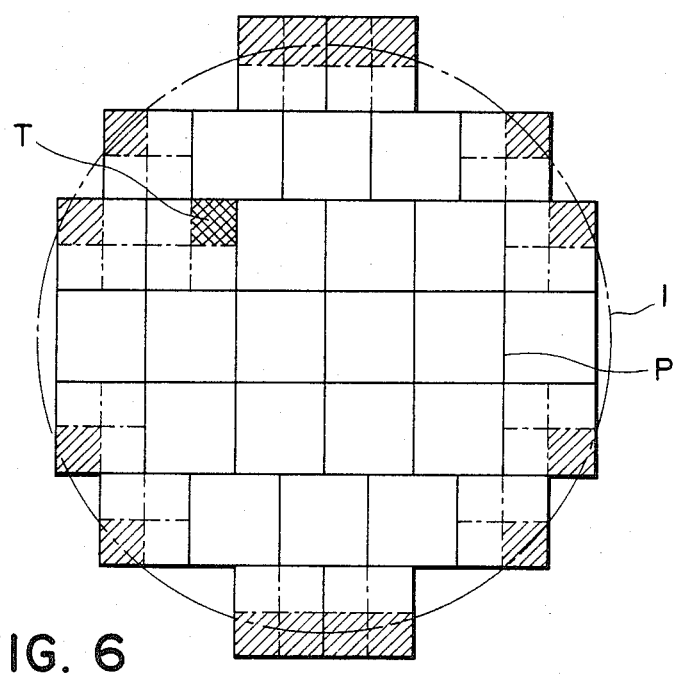
FIGS. 6, 7, 8 and 9 illustrate examples of combinations of the exposure pattern and the chip areas of the wafer.
Figure 7:
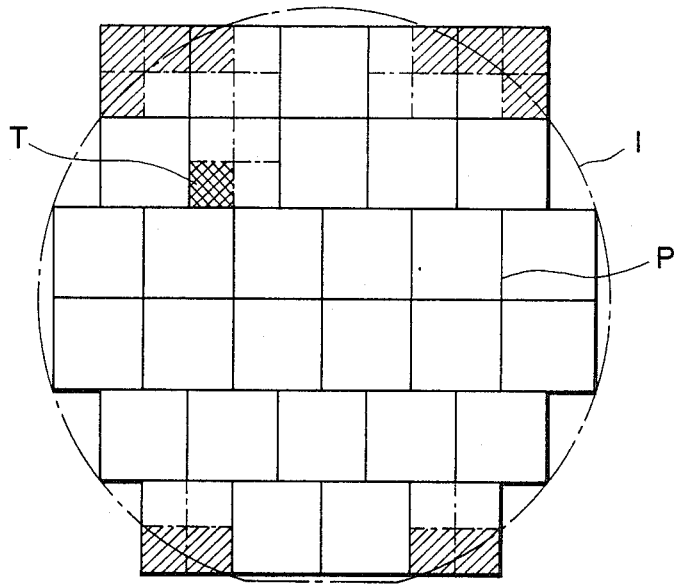
Figure 8:
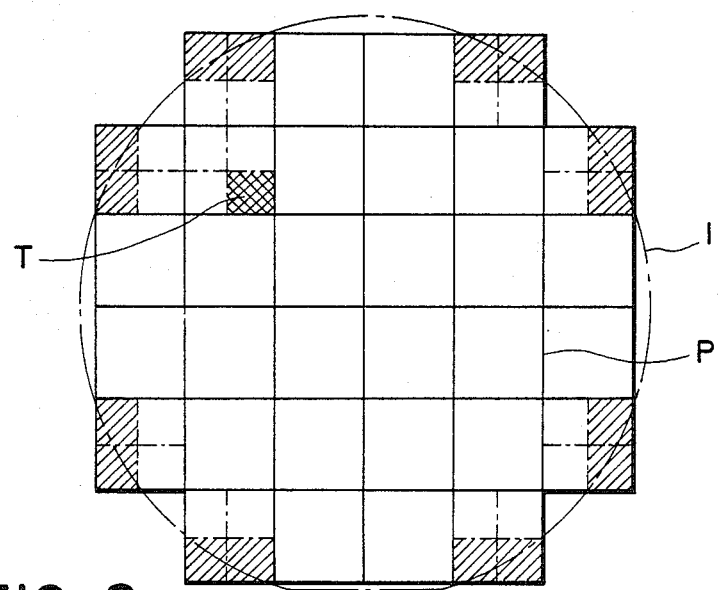
Figure 9:
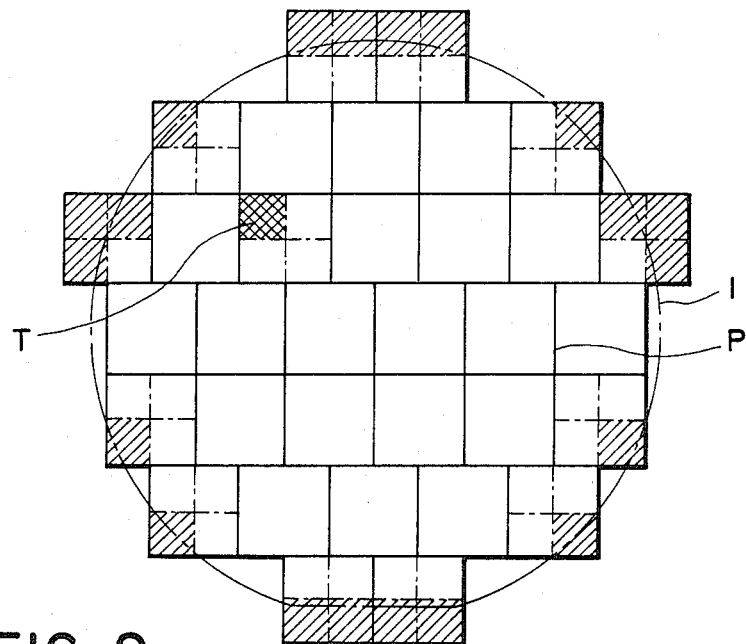

|  | No. of Effective Chips | No. of Shots | Time Required |
| --- | --- | --- | --- |
| Ex. 1/FIG. 6 | 112 | 32 | 32 tl + 32 ts |
| Ex. 2/FIG. 7 | 112 | 31 | 30 tl + 31 ts |
| Ex. 3/FIG. 8 | 112 | 32 | 31 tl + 32 ts |
| Ex. 4/FIG. 9 | 112 | 33 | 33 tl + 33 ts | tl: Time for one stepping operation.
ts: Time for one exposure from the end of the step.

As will be understood from the Table, the time required for processing one wafer is different even if the number of shots in the same. As a result of comparison, the quickest mode is the second Example, followed by the third, first and fourth Examples in the order named.

In the foregoing examples, it is a premise that the number of effective chips is fixed, under the condition that the exposure pattern has four-chip multiple circuit patterns. And, the determination is made for the purpose of the quickest processing of one wafer under such conditions. It is possible to add another condition relating to how many minimum chips are effective for one shot at the marginal area of the effective range of the wafer when a mask of multiple patterns covering plural chips is used, for example, the condition that when there are not less than two effective chips to be exposed by one shot, the shot is to be carried out, but when there is only one effective chip for one shot, the shot is not to be carried out. Because of these additional conditions, the number of wafers exposed per unit time is increased, so that the shot arrangement is determined with the priority of the productivity, depending on the relation between the time required in consideration of the properties peculiar to the apparatus, such as the time for exchanging the wafer, and the number of effective chips.

Within the processor control unit 5, the effective area is obtained from the set signal of the ineffective area N of the wafer 1 and the measurements of the wafer outer diameter; the exposure pattern P is applied to a given part of the effective area; the exposure pattern P and the wafer 1 are relatively moved in X and Y directions on the basis of the size of the chip T; and the effective chip number, exposure shot number and the required time are calculated; and then the desired shot arrangement is determined. Then the processor and control unit 5 controls the stepwise movement of the X-Y table 4 in accordance with the determination. Since there is the dimension measuring device 2 at a part of the wafer 1 conveying passage, the arrangement of shots can be determined for each of the wafers 1 which can have different outer diameters.

In the foregoing embodiment, the arrangement of shots is determined, by way of simulation, wherein the exposure pattern P and the wafer 1 are relatively moved, on the basis of the input data. However, it is a possible alternative to memorize various shot arrangements and store them in the memory means 9, from which the proper one is selected.

As described above, according to the present invention, the number of the required shots and the time required for one wafer 1 are calculated by the processor control unit as to several shot arrangements which meet various conditions set in, so that the shot arrangements provide minimum time required for one entire wafer from the standpoint of the number of effective chips, or the shot arrangements from the standpoint of productivity in terms of the number of effective chips, can be selected, with the result of the efficient operation. Also, the higher yield can be provided.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:
   means for producing relative stepping movement between a mask and a radiation sensitive member;
   means for providing a first signal relating to an arrangement of plural chip patterns of the mask for one shot for exposing the radiation sensitive member to the chip patterns;
   means for providing a second signal relating to a dimension of one chip pattern;
   means for providing a third signal relating to a dimension of the radiation sensitive member;
   means for selecting a shot arrangement from plural possible shot arrangements on the basis of the first, second and third signals; and
   means for controlling said relative stepping movement producing means in accordance with the selected shot arrangement.

2. An apparatus according to claim 1, further comprising means for providing said selecting means which a signal relating to a size of ineffective area of the radiation sensitive member.

3. An apparatus according to claim 1, further comprising means for illuminating the mask.

4. An apparatus according to claim 1, further comprising means for projecting an image of the mask onto the radiation sensitive member.

5. An apparatus according to claim 4, wherein the radiation sensitive member is a silicon wafer having a photoresist layer.

6. An apparatus according to claim 1, wherein said first signal means and second signal means are manually supplied with information.

7. An apparatus according to claim 1, wherein said third signal means automatically measures the dimension of the radiation sensitive member.

8. A method of step exposure, comprising the steps of:
   providing a pattern signal relating to an arrangement of plural chip patterns for one shot of exposure;
   providing a chip signal relating to a dimension of one chip pattern;

providing a wafer signal relating to a dimension of the radiation sensitive member;

forming a plurality of shot arrangement modes, on the basis of the pattern signal, chip signal and wafer signals;

selecting a shot arrangement mode from the plurality of shot arrangement modes; and repeatedly exposing the wafer by shots and producing relative step movement in accordance with the selected shot arrangement.

9. A method according to claim 8, wherein, when the shot arrangement modes are formed, an ineffective area of the wafer is taken into account.

10. A method according to claim 8, wherein the selected shot arrangement mode provides the shortest time for all the shots to be made in the effective area of the wafer.

11. A method according to claim 8, wherein the selected shot arrangement mode provides the largest number, per unit time, of shots in the effective area.

* * * * *

UNITED STATES PATENT AND TRADEMARK OFFICE
CERTIFICATE OF CORRECTION

PATENT NO.  : 4,530,587

DATED       : July 23, 1985

INVENTOR(S) : MASAO KOSUGI ET AL.

It is certified that error appears in the above-identified patent and that said Letters Patent is hereby corrected as shown below:

Column 2, line 63, "point the" should read --point of the--.

line 66, "tor 6" should read --tors 6--.

Column 3, line 32, "in" should read --is--.

Column 4, line 46, "which a signal" should read --with a --signal--.

Signed and Sealed this

Second Day of September 1986

[SEAL]

Attest:

DONALD J. QUIGG

Attesting Officer

Commissioner of Patents and Trademarks